United States Patent
Malone et al.

(10) Patent No.: US 7,347,058 B2
(45) Date of Patent: Mar. 25, 2008

(54) VENT FOR A DATA CENTER COOLING SYSTEM

(75) Inventors: Christopher Gregory Malone, Rockline, CA (US); Abdlmonem H Beitelmal, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 548 days.

(21) Appl. No.: 10/970,889

(22) Filed: Oct. 21, 2004

(65) Prior Publication Data

US 2006/0086119 A1 Apr. 27, 2006

(51) Int. Cl.
*F24F 7/00* (2006.01)
*F25D 17/00* (2006.01)
*F25D 17/04* (2006.01)
*F25D 23/12* (2006.01)
*H05K 7/20* (2006.01)

(52) U.S. Cl. ............ 62/259.2; 62/186; 236/49.3; 361/690

(58) Field of Classification Search ............ 62/259.2, 62/186, 187; 236/49.3, 51; 361/690, 688, 361/687; 454/75, 258
See application file for complete search history.

(56) References Cited

U.S. PATENT DOCUMENTS 5,348,078 A * 9/1994 Dushane et al. ............ 165/209
6,574,104 B2 * 6/2003 Patel et al. ................. 361/695

* cited by examiner

*Primary Examiner*—Chen-Wen Jiang

(57) ABSTRACT

In an embodiment of a vent for a data center cooling system the vent has a body that has a fluid outlet. The body of the vent also has a member that can be adjusted to obstruct the fluid outlet. Mounted to the body of the vent is an electromechanical assembly for effecting an adjustment of the member. The body also has a battery for powering the electromechanical assembly.

18 Claims, 4 Drawing Sheets

VENT FOR A DATA CENTER COOLING SYSTEM

FIELD OF THE INVENTION

The present invention relates generally to a vent for a data center cooling system and has particular, but by no means exclusive, application as an outlet vent for allowing cooling fluid to escape from the cooling system.

BACKGROUND OF THE INVENTION

A data center can be described as a room that houses a number of racks containing computer, or other electronic, equipment. Racks in use today are generally capable of containing around forty individual systems, with future rack configurations being capable of containing up to eighty or more systems.

A typical circuit board that is fitted to a rack has numerous electronic components including processors, micro-controllers, video cards, and memory. The typical circuit board can dissipate approximately 250 watts of power. Therefore a single rack in use today that contains around forty systems can dissipate around 10,000 watts of power.

It is not uncommon to house between eighty and one hundred racks in a single room. In light of the amount of power that each rack can dissipate, the ambient temperature of the single room can become unacceptably high without adequate cooling. Most data centers employ a cooling system for cooling rooms that house the racks. A typical cooling system includes a unit for generating a flow of cooling fluid (which is normally cooled air) and a plenum that is defined by a raised floor in the room that houses the racks. The cooling fluid from the unit generally flows through the plenum and out thereof in to the room via vents fitted to the openings in the raised floor.

Adjustable vents have been developed that can be fitted to the openings in the raised floor. The adjustable vents can be adjusted so that the flow of cooling fluid from the vent provides the required environmental conditions in the room housing the racks. Typically, this could involve restricting the outlet area of the vent so as to reduce the flow of cooling fluid therefrom to cause the ambient temperature of the room to increase.

The adjustable vents include an electromechanical assembly that enables the vent to be adjusted remotely. The electromechanical assembly generally includes a drive motor for opening and closing a vent shutter. The electromechanical assembly receives power for the drive motor from a remote power source via an electrical cable that is usually located in the plenum. This technique of providing the drive motor with power can be expensive, inconvenient, and add to the collection of cables located in the plenum.

SUMMARY OF THE INVENTION

In an embodiment of a vent for a data center cooling system the vent has a body that has a fluid outlet. The body of the vent also has a member that can be adjusted to obstruct the fluid outlet. Mounted to the body of the vent is an electromechanical assembly for effecting an adjustment of the member. The vent also has a battery for powering the electromechanical assembly.

The present invention will be more fully understood from the following description of specific embodiments. The description is provided with reference to the accompanying drawings.

DETAILED DESCRIPTION

Figure 1:
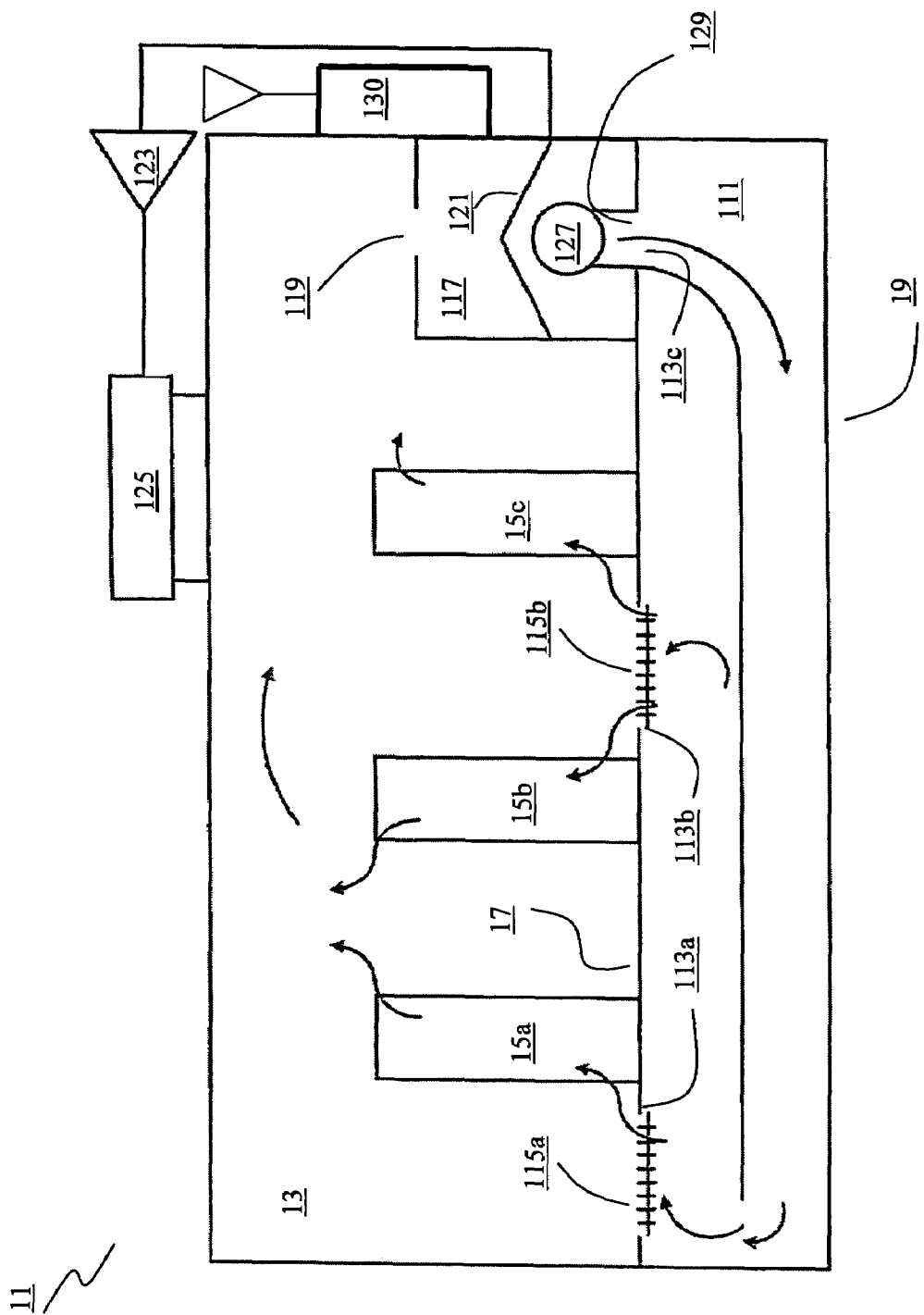
FIG. 1 shows a simplified schematic illustration of a data center.

As can be seen in FIG. 1, a data center 11 includes a room 13 that houses a number of racks 15. In this regard, it is envisaged that the room 13 houses, for example, anywhere between one and one hundred racks 15(a-c). In an embodiment, each rack 15(a-c) is an Electronics Industry Association (EIA) enclosure that is typically 78 inches high, 19 inches wide and 30 inches deep. Whilst not shown in the figures, each rack 15 is fitted with a number of systems each of which includes electronic components such as a micro-controller, video card, and memory. It is envisaged that each rack 15 is fitted with at least forty systems. The systems may be arranged to function as, for example, computer servers for routing, switching and logging data packets.

The room 13 includes a floor 17 that is raised above the ground level 19 of the room 13. The racks 15 are secured to the floor 17. The floor 17 and the ground level 19 of the room 13 define a plenum 111, which is the void located between the floor 17 and the ground level 19. The floor 17 includes a number of openings 113 that are located between adjacent racks 15. Some of the openings 113a and 113b are fitted with an adjustable vent 115.

The data center 11 also includes a cooling system 117 for generating a flow of cooling fluid in the form of cooled air. In the present embodiment, the cooling system 117 includes a fluid return inlet 119 for receiving air from the room 13, a cooling coil 121 for cooling the air received by the fluid return inlet 119, and a compressor 123 and condenser 125 that cooperate with each other to cool the coil 121. As persons skilled in the art will readily appreciate, the cooling system 117 in an alternative embodiment acts as a heat exchanger that receives a flow of chilled water that has been cooled by a water chiller, which is external to the room 13. The cooling system 117 also includes a fan 127 and a fluid outlet 129 that is in fluid communication with one of the openings 113 in the floor 17. The fan 127 generates a flow of cooling fluid (which is the air that has been cooled by the coil 121) that enters the plenum 111 via the fluid outlet 129 and the opening 113c that is in fluid communication therewith. The flow of cooling fluid travels along the plenum 111 and escapes therefrom in to the room 13 via the adjustable vents 115. The flow of cooling fluid from the vents 115 disperses throughout the room 13 to cool the systems fitted to the racks 15.

The data center 11 also includes a control system 130 for adjusting the cooling system 117 and the vents 115. The control system 130 effects an adjustment of the vents 115 and/or the cooling system 117 to bring about the required environmental conditions in the room 13. For example, the control system 130 can adjust the operational parameters of the compressor 123 so as to set the temperature of the cooling fluid that enters the plenum 111. Whilst not shown in the figures, the control system 130 includes an electronic processing system for processing feedback data that includes information on the environmental conditions in the room 13, for example the temperature and humidity level in the room 13.

It is noted that whilst FIG. 1 indicates that the control system 130 is a 'global' controller in that it effectively controls all of the vents 115, it is envisaged in alternative embodiments that the control system 130 is local in nature. For example, the control system 130 would consist of several 'control elements' fitted to the racks 15. In this embodiment, the control elements would control only those vents 115 that are located near the respective racks 15. For instances, the control element fitted to rack 15a would only control vent 115a.

Figure 2:
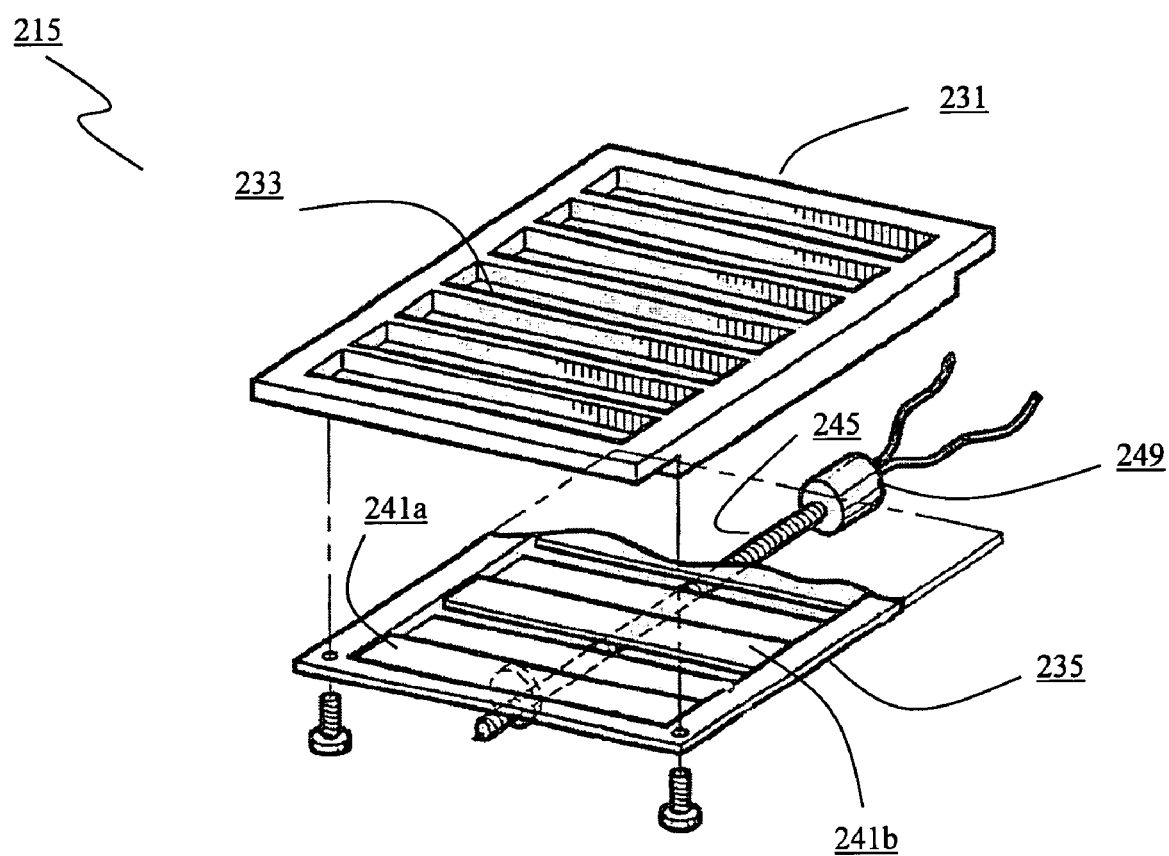
FIG. 2 shows an embodiment of a vent that is fitted to a floor of the data center illustrated in FIG. 1.
Figure 3:
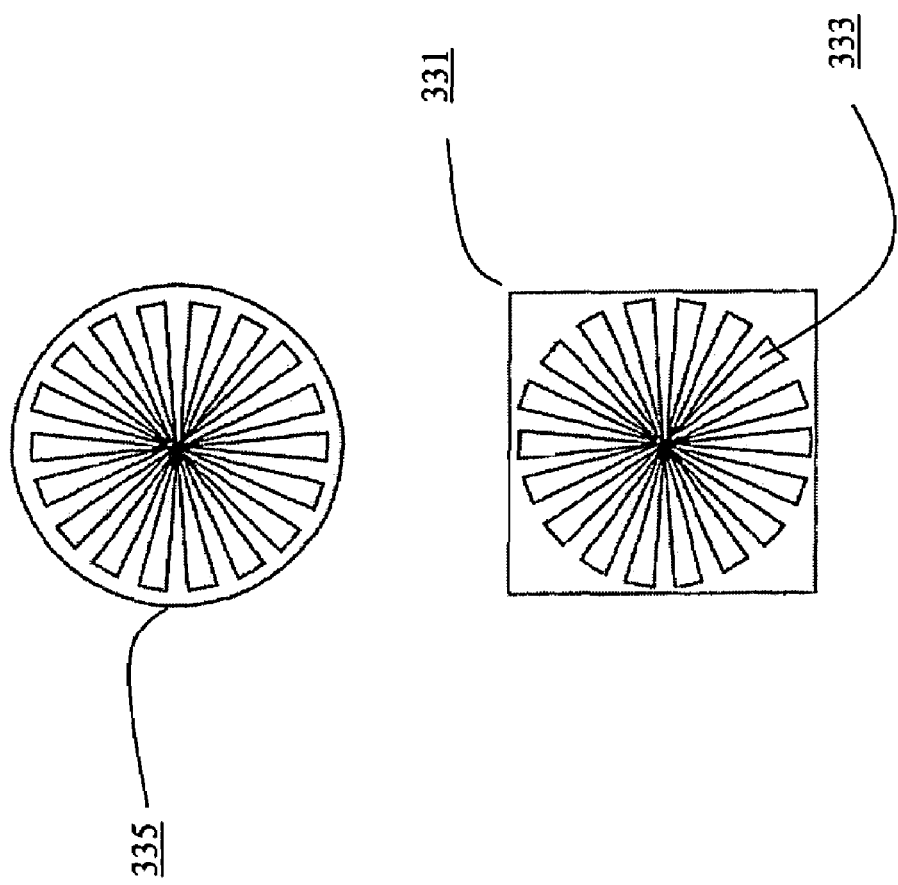
FIG. 3 shows an alternative embodiment of the vent shown in FIG. 2.

The vents 115 are adjustable so as to allow the flow of cooling fluid escaping therefrom to be controlled. In this regard, the vents 115 can be adjusted so as to be opened or closed by a desired amount. FIG. 2 shows a particular embodiment of a vent 215. In the particular embodiment, the vent 215 includes a body 231 in the form of a standard 2'×2' vent grille. The body 231 is made from metal, but it is envisaged that in alternative embodiments the body 231 can be made from a different material such as plastic. The body 231 has a number of slots 233 that act as fluid outlets for allowing the flow of cooling fluid in the plenum 111 to pass through the body 231. The body 231 also includes a member 235 that can be adjusted to obstruct the slots 233 of the body 231. In an embodiment, the member 235 is made of a metal material, but in alternative embodiments can be made from other materials including plastic. It will be readily appreciated by those skilled in the art that the body 231 of the vent 215 can be in different forms. For example, FIG. 3 shows an alternative embodiment in which the body 331 and the member 335 are circular in form.

Figure 4:
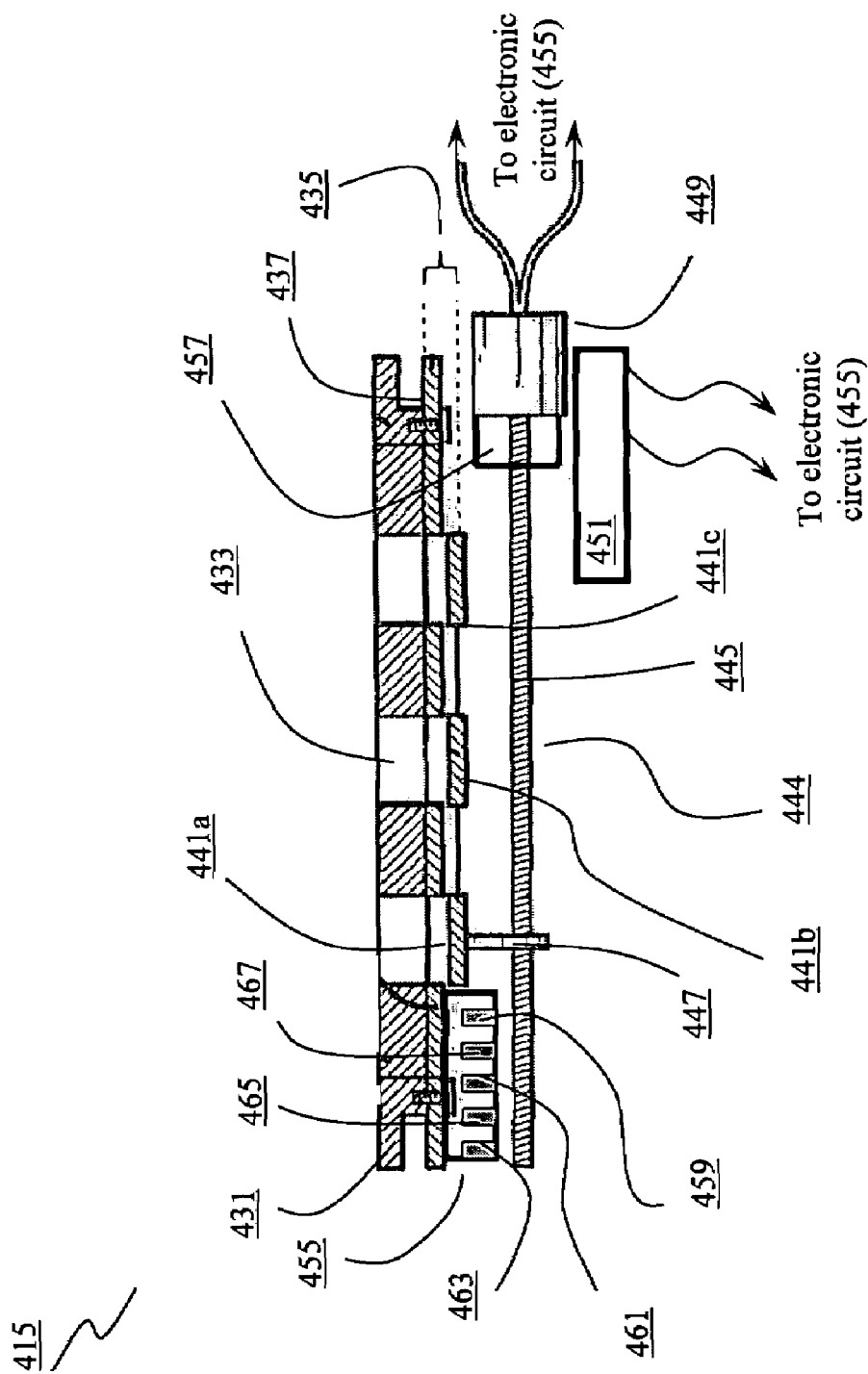
FIG. 4 shows an embodiment of an electromechanical assembly fitted to the vent shown in FIG. 2.

With reference to FIG. 4, the member 435 that can be adjusted to obstruct the slots 433 includes a stationary vane plate 437 that is screwed to an underside of the body 431 and a movable vane plate (not illustrated) that has a number of spaced apart vanes 441. The movable vane plate is moveably mounted to the stationary vane plate 437. By moving the movable vane plate the spaced apart vanes 441 can be positioned to obstruct the slots 433 in the body 431.

The particular embodiment of the vent 415 also includes an electromechanical assembly 444 for effecting an adjustment of the member 435. More specifically, the electromechanical assembly 444 is arranged to move the vanes 441. The electromechanical assembly 444 includes a drive screw 445 and a drive link 447 that is connected to one or more of the vanes 441 of the moveable vane plate. The drive link 447 also has a threaded aperture (not shown in the figures) in which the drive screw 445 is located. The electromechanical assembly 444 also has a drive motor 449 that is connected to the drive screw 445. When supplied with an electrical current the drive motor 449 rotates the drive screw 445, which in turn causes the drive link 447 to move along a longitudinal axis of the drive screw 445. The movement of the drive link 447 along the drive screw 445 causes the vanes 441 to be moved relative to the slots 433 to provide the required amount of obstruction to the slots 433. To power the drive motor 449, the vent 415 includes a battery 451.

An advantage of incorporating the battery 451 in to the vent 415 is that it eliminates the need to obtain power for the drive motor 449 from a remote power source. Obtaining power for the drive motor 449 from a remote power source is generally undesirable because it requires the use of electrical cables to deliver the power from the remote power source to the drive motor 449. Use of electrical cables incurs additional expense, and can result in a large number of cables being located in the plenum 111 as cables in the data center are generally located in the plenum 111. A further advantage of using the battery 451 is that it enables the layout of the floor 17 to be readily rearranged, which is a result of the fact that the vent 415 does not need to be rewired in order to obtain power for the drive motor 449.

The vent 415 also includes an electronic circuit 455 that is electronically coupled to the battery 451 and the drive motor 449. As discussed in the following paragraphs of this specification, the electronic circuit 455 is arranged to make and break an electrical connection between the battery 451 and the drive motor 449. The electronic circuit 455 is also arranged to create first data, which can contain information about an attribute of the slots 433. In particular, this information includes an area of the slots 433 that is not obstructed by the vanes 441 of the movable vane plate. To determine the area of the slots 433 that is not obstructed by the vanes 441, the electronic circuit 455 includes a location sensor 457 that enables the electronic circuit 455 to determine the location of the vanes 441 relative to the slots 433. In an embodiment, the location sensor 457 is in the form of a potentiometer that is adjusted as the drive screw 445 rotates. The electronic circuit 455 uses the voltage output of the potentiometer as an indication of the location of the vanes 441 relative to the slots 433.

Another piece of information that the first data can contain is information about a status of the battery 451. More specifically, the status information includes a level of energy stored in the battery 451. In an alternative embodiment, the information about the status of the battery 451 is an indicator that indicates the battery 451 is almost flat. In order to gather the information about the status of the battery 451, the electronic circuit 455 includes a current sensor (not shown in the figures) that measures the flow of current from the battery 451 to the electronic circuit 455.

The first data can also contain information about an environment surrounding the vent 415. In particular, this information includes the pressure of cooling fluid in the plenum 111, the ambient temperature of air in the room 13, and the level of humidity in the room 13. To collect this information the electronic circuit 455 includes a pressure sensor 459 for measuring the pressure of the cooling fluid in the plenum 111, a temperature sensor 461 for measuring the temperature in the room 13, and a moisture sensor 463 for measuring the humidity in the room 13.

The first data can also contain information on the characteristics of the cooling fluid passing through the slots 433. For instance, this includes the velocity and flow rate of the cooling fluid exiting the slots 433. In this regard, the electronic circuit 455 includes appropriate flow rate sensors (which are not illustrated in the figures for clarity reasons).

The main reason the electronic circuit 455 creates the first data is to make available information (feedback data) for the electronic processing system of the control system 130. To transfer the first data to the control system 130, the electronic circuit 455 of the vent 415 includes a radio frequency transmitter 465 for transmitting the first data on a radio frequency signal. In this regard, the control system 130 includes a radio receiver for receiving and decoding the radio frequency signal that is transmitted by the electronic circuit 455 of the vent 415.

It is envisaged that in an alternative embodiment the first data would be transmitted via a data cable instead of on the radio frequency signal.

If on processing the first data the electronic processing system of the control system 130 determines that a vent 415 needs to be adjusted, the electronic processing system will generate second data that includes information about an adjustment to be made to the vent 415. For example, the adjustment may be such that the vanes 441 are moved to provide more or less obstruction to the slots 433. This in turn will bring about a change in the characteristics of the flow of the cooling fluid escaping from the vent 415.

To convey the second information to the vents 115, the electronic processing system of the control system 130 includes a radio frequency transmitter for transmitting the second data on a radio frequency transmitter. In this regard, the electronic circuit 455 of the vent 415 includes a radio frequency receiver 467 for receiving and decoding the second data from the radio frequency signal transmitted by control system 130.

It is envisaged that in a alternative embodiment the second data would be transmitted via a data cable instead of the radio frequency signal.

On receiving the second data from the control system 130 the electronic circuit 455 of the vent 415 processes the second data to determine whether an adjustment is to be made to the movable vanes 441. In this regard, the electronic circuit 455 establishes an electrical circuit between the drive motor 449 and the battery 451 so that current from the battery 451 causes the drive motor 449 to rotate the drive screw 445, and thereby adjust the vanes 441 to obstruct the slots 233 as required.

What is claimed is:

1. A vent for a data center cooling system, the vent comprising:
   a body that has a fluid outlet and a member that can be adjusted to obstruct the fluid outlet;
   an electromechanical assembly mounted to the body for effecting an adjustment of the member;
   an electronic circuit for creating first data that comprises information about an attribute of the fluid outlet, wherein the information about the attribute of the fluid outlet comprises an area of the fluid outlet that is unobstructed by the member; and
   a battery for powering the electromechanical assembly.

2. The vent as claimed in claim 1, wherein the first data comprises information about a status of the battery.

3. The vent as claimed in claim 2, wherein the information about the status of the battery comprises a level of energy stored in the battery.

4. The vent as claimed in claim 2, wherein the information about the environment comprises; a pressure of cooling fluid in a plenum of the data center cooling system; a temperature of the environment; and a humidity of the environment.

5. The vent as claimed in claim 1, wherein the first data comprises information about an environment surrounding the vent.

6. The vent as claimed in claim 1, wherein the electronic circuit comprises a radio frequency transmitter for transmitting the first data on a radio frequency signal.

7. The vent as claimed in claim 1, wherein the electronic circuit comprises a receiver for receiving second data that comprises information about a characteristic of the fluid outlet, the electronic circuit being capable causing the adjustment assembly to adjust the member to bring about the characteristic of the fluid outlet.

8. The vent as claimed in claim 7, wherein the information about the characteristic of the fluid outlet comprises an area of the fluid outlet that is to be unobstructed by the member.

9. The vent as claimed in claim 7, wherein the receiver comprises a radio frequency receiver for receiving another radio frequency signal that comprises the second data.

10. A data center comprising a vent that comprises:
    a body that has a fluid outlet and a member that can be adjusted to obstruct the fluid outlet; and
    an electromechanical assembly mounted to the body for effecting an adjustment of the member;
    an electronic circuit for creating first data that comprises information about an attribute of the fluid outlet, wherein the information about the attribute of the fluid outlet comprises an area of the fluid outlet that is unobstructed by the member; and
    a battery for powering the electromechanical assembly.

11. The data center as claimed in claim 10, wherein the first data comprises information about a status of the battery.

12. The data center as claimed in claim 11, wherein the information about the status of the battery comprises a level of energy stored in the battery.

13. The data center as claimed in claim 11, wherein the information about the environment comprises: a pressure of cooling fluid in a plenum of the data center cooling system; a temperature of the environment; and a humidity of the environment.

14. The data center as claimed in claim 10, wherein the first data comprises information about an environment surrounding the vent.

15. The data center as claimed in claim 10, wherein the electronic circuit comprises a radio frequency transmitter for transmitting the first data on a radio frequency signal.

16. The data center as claimed in claim 10, wherein the electronic circuit comprises a receiver for receiving, second data that comprises information about a characteristic of the fluid outlet, the electronic circuit being capable of causing the adjustment assembly to adjust the member to bring about the characteristic of the fluid outlet.

17. The data center as claimed in claim 16, wherein the information about the characteristic of the fluid outlet comprises an area of the fluid outlet that is to be unobstructed by the member.

18. The data center as claimed in claim 16, wherein the receiver comprises a radio frequency receiver for receiving another radio frequency signal that comprises the second data.

* * * * *

UNITED STATES PATENT AND TRADEMARK OFFICE
CERTIFICATE OF CORRECTION

PATENT NO. : 7,347,058 B2  Page 1 of 1
APPLICATION NO. : 10/970889
DATED : March 25, 2008
INVENTOR(S) : Christopher Gregory Malone et al.

It is certified that error appears in the above-identified patent and that said Letters Patent is hereby corrected as shown below:

In column 5, line 46, in Claim 4, after "comprises" delete ";" and insert --: --, therefor.

In column 6, line 2, in Claim 7, after "capable" insert -- of --.

In column 6, line 41, in Claim 16, after "receiving" delete ",".

Signed and Sealed this

Thirtieth Day of June, 2009

JOHN DOLL
*Acting Director of the United States Patent and Trademark Office*